Jan. 14, 1964
N. FREEDMAN
3,118,116
OSCILLATOR FREQUENCY SELECTING CIRCUITS
Filed Jan. 30, 1959
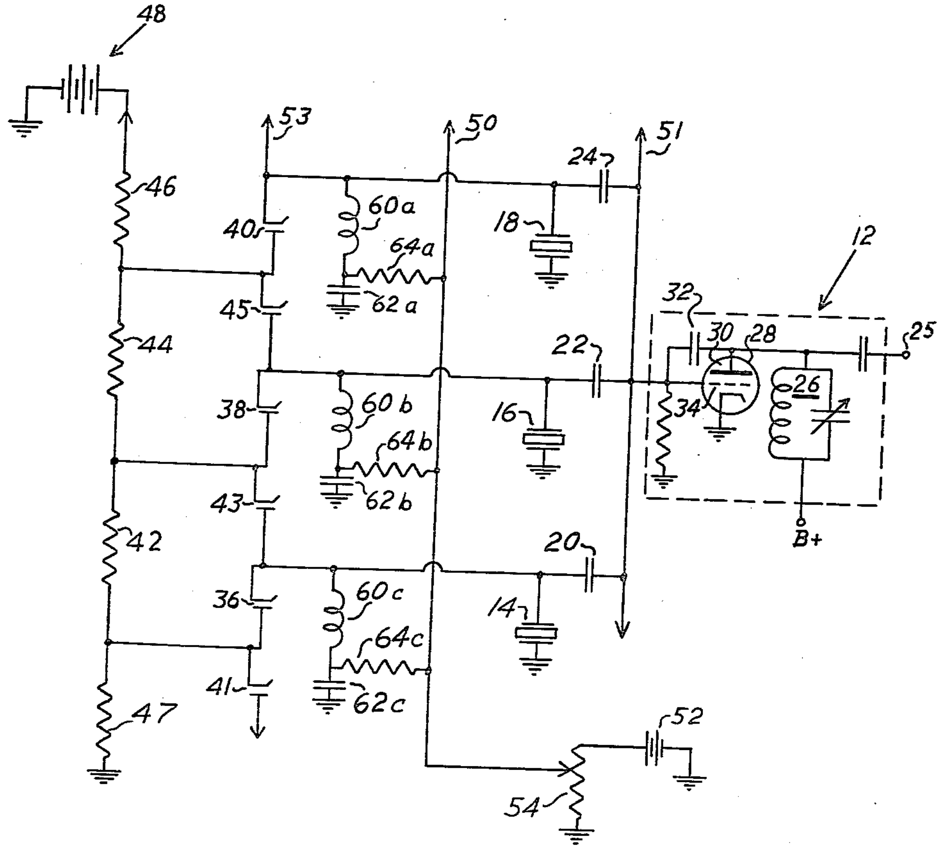
INVENTOR
NATHAN FREEDMAN
BY N. Vincent Harcha
ATTORNEY United States Patent Office 3,118,116
Patented Jan. 14, 1964

3,118,116
OSCILLATOR FREQUENCY SELECTING CIRCUITS

Nathan Freedman, West Newton, Mass., assignor to Raytheon Company, Lexington, Mass., a corporation of Delaware Filed Jan. 30, 1959, Ser. No. 790,297
9 Claims. (Cl. 331—161)

This invention relates to a frequency selecting circuit and, more particularly, to a circuit capable of electronically selecting and generating a plurality of discrete frequencies.

In the transmission of intelligence for the purpose of telemetering or for rapidly varying radar or communications transmitter frequencies, it is often advantageous to provide for the simultaneous generation and selection in a single oscillator circuit of a plurality of different frequencies, each of which is highly stabilized in frequency. This is particularly true, for example, when compensating for vehicle motion in coherent Moving Target Indicator (MTI) radars in which the radar is mounted on a moving vehicle. For this purpose it is desirable to generate two or more precise high frequencies, one of which can be varied a closely controlled amount in accordance with the motion of the vehicle. However, it is to be understood that the circuit is not to be limited to the particular above-described usage and that the details herein shown and described are only for purposes of illustration.

In accordance with the frequency selecting circuit of the invention a single oscillator and a feedback network utilizing a plurality of piezoelectric elements are used for the generation of high frequency signals over a range of frequencies which are relatively close together. Each piezoelectric resonating element, such as a quartz crystal, in the feedback network is capacitively coupled to the positive feedback path of the oscillator and shunted by a series of rectifiers or diodes which are biased by voltage divider action to conduct at a particular applied bias voltage. The state of conduction of each diode in the series is determined by a variable direct current control voltage of sufficient amplitude to overcome the applied reference bias voltage. The control voltage is fed through a common control line to cut off the selected diode in the network and actuate the associated crystal so as to produce oscillation at the frequency of the associated crystal. In this manner, the particular crystal resonator which is not shunted by a conducting diode is the frequency determining element of the oscillator. To prevent two or more crystal resonators from simultaneously oscillating and interacting with each other, a frequency quenching diode is connected so as to load each crystal circuit and is adapted to conduct at a slightly higher voltage than the voltage applied to each frequency controlling diode. In addition, a decoupling network is connected between each crystal resonator and the common control line.

Further objects and many of the attendant advantages of this invention will be readily appreciated as the description thereof progresses.

In the accompanying drawing, there is shown a diagram of the oscillator frequency selecting circuit of the invention. This selecting circuit comprises an oscillator 12, the input of which is capacitively coupled to quartz crystals 14, 16 and 18 by means of crystal buffer capacitors 20, 22 and 24, respectively, to form a crystal controlled oscillator capable of providing three precise frequencies at output terminal 25. It should be understood that any type of crystal oscillator can be employed provided the tuned plate circuit 26 is sufficiently broad to provide gain over the frequencies determined by the crystals. In particular, oscillator 12, in this embodiment, comprises a conventional triode tube 28 having an anode 30 connected to a source of direct current B+ through the tuned circuit 26. In order to provide a positive feedback path, a feedback capacitor 32 is connected between the anode 30 and the control electrode 34. Feedback capacitor 32 is preferably a 10 micromicrofarad capacitor, although, at very high frequencies, the interelectrode capacity of the tube can supply the required positive feedback loop from anode to control electrode. Each quartz crystal is shunted by frequency controlling diodes 36, 38 and 40, which are biased to conduction at a particular reference voltage by 100-ohm voltage divider resistors 42, 44 and 46 and 400-ohm resistor 47 connected to a source of direct current bias voltage 48. This source of voltage in the present embodiment is approximately +7.0 volts in order to apply approximately +6.0 volts to the anode of diode 40, +5.0 volts to diode 38 and +4.0 volts to diode 36 through the aforementioned voltage divider resistors. Also connected in the diode circuit are nonconducting frequency quenching diodes 41, 43 and 45, which are connected in series with each frequency controlling diode, and biased to conduct at a voltage level slightly higher than the actuating voltage applied to each preceding frequency controlling diode. Diode 41 is used when additional diodes are added to the system. A direct-current control voltage line 50 is connected to a source of direct-current voltage 52 of approximately +7.0 volts through a potentiometer 54. In order to prevent radio frequency energy from the respective crystals from entering the control voltage line and, also, to prevent the crystal resonators from interacting with each other, decoupling networks are provided which comprise one millihenry inductances *60a*, *60b*, *60c*, .01 microfarad capacitors *62a*, *62b*, *62c* and 2,000-ohm diode current-limiting resistors *64a*, *64b*, *64c* adapted to permit a relatively small current to flow in the diode circuit.

In operation, when the control voltage is set to zero volts, control diodes 36, 38 and 40 are normally conducting. However, when the control voltage is adjusted by potentiometer 54 to exceed, for example, the +4.0 volts applied to the anode of diode 36, conduction in that diode is immediately terminated by the application of this increased voltage through inductance *60c* and resistor *64c*. This increased voltage, say +4.5 volts, is also applied to the anode of diode 43 which remains in the nonconducting state by means of the +5.0 volts applied to its cathode. However, crystal 14 is no longer shunted by conducting diode 36 and is, therefore, permitted to oscillate at its resonant frequency, $f_1$. As the potentiometer increases the voltage to more than +5.0 volts, quenching diode 43 conducts and quenches the initial frequency $f_1$. Simultaneously, diode 38 is driven to nonconduction, initiating frequency $f_2$ from crystal 16, since both diode 38 and diode 45 are nonconducting. In this manner, oscillation over a large number of precise frequencies can be achieved by a single control voltage, the number of diode stages and crystals being increased by connecting them to the matrix or control lines 50, 51 and 53. Additional resistors are then added to the voltage divider to provide suitable reference voltages. The only limitation to this additive process is that the added crystals in the feedback network must lie within a range of frequencies determined by the response characteristic of tank circuit 26 and the attenuation characteristics of the feedback network. Thus, for each individual level of voltage applied to the control voltage line 50, oscillations at only a single frequency are generated at output terminal 25 or matrix line 51, since the control voltage applied to the network causes the quenching diode for initial frequency $f_1$ to conduct substantially simultaneously with the driving of the control diode for the succeeding frequency $f_2$ to nonconduction. By this diode network, therefore, a plurality of signals at discrete frequencies can be generated by a single signal of rapidly varying amplitude, such as for example, a telemetering signal or a coded information signal used in communications.

For the foregoing reasons, it is to be understood that the above-described arrangements are illustrative of the application of the principles of the invention. Numerous other arrangements may be devised by those skilled in the art without departing from the spirit and scope of the invention. Accordingly, it is desired that the invention not be limited to the particular details of the embodiments disclosed herein except as defined in the appended claims.

What is claimed is:

1. In combination, an oscillator, a plurality of resonating elements connected to the input of said oscillator in a manner adapted to provide oscillations at the individual frequencies of said elements, a unidirectional current conducting device shunting each of said elements, means for applying individual reference voltages to said devices to maintain said devices in a conductive state, and means for applying a control voltage of varying amplitude to all of said devices selectively to drive individual devices to nonconduction in response to predetermined amplitudes of said control voltage.

2. A frequency selecting circuit which is selectively responsive to voltages which are higher than a predetermined amplitude comprising an oscillator, a plurality of crystals connected to the input of said oscillator in a manner adapted to provide oscillations at the individual frequencies of said crystals, a diode shunting each of said crystals, voltage divider means including a plurality of resistance elements connected in series for applying individual reference voltages of progressively greater amplitude to said diodes, and control line means for applying to said diodes from a common source a control voltage of varying amplitude and of a polarity to overcome the applied reference voltages and selectively drive predetermined diodes to nonconduction in response to a predetermined amplitude of said control voltage.

3. An oscillator frequency selecting circuit which is selectively responsive to voltages which are higher than a predetermined amplitude comprising an oscillator, a plurality of crystals connected in the positive feedback path of said oscillator in a manner adapted to provide oscillations at the individual frequencies of said crystals, a voltage sensitive impedance shunting each of said crystals, a voltage divider including a plurality of resistance elements connected in series for applying individual reference voltages of progressively greater amplitude to said voltage sensitive impedances, a source of direct current of varying amplitude, and a control line connected to said source of direct current and said voltage sensitive impedances to apply from a common source of voltage of varying amplitude to overcome the applied reference voltages and to substantially increase the impedance of individual voltage sensitive impedance elements in response to a particular amplitude of said varying voltage.

4. A frequency selecting circuit which is selectively responsive to voltages which are higher than a predetermined amplitude comprising an oscillator, a plurality of crystals connected to the input of said oscillator in a manner adapted to provide oscillations at the individual frequencies of said crystals, a unidirectional current device shunting each of said crystals, means for applying an individual reference voltage to each of said unidirectional current devices to maintain said current devices in a conductive state, and means for applying from a common source a control voltage of varying amplitude to said current devices to overcome the applied reference voltage and selectively drive the associated current device to nonconduction in response to a predetermination amplitude of said control voltage.

5. A frequency selecting circuit which is responsive to voltages which are higher than a predetermined amplitude comprising an oscillator, a plurality of crystals connected to the input of said oscillator in a manner adapted to provide oscillations at the individual frequencies of said crystals, a plurality of frequency quenching diodes, a control diode shunting each of said crystals, each of said control diodes alternately connected in series with a frequency quenching diode which is adapted to block oscillation of the associated crystal at a higher voltage than the voltage applied to the corresponding control diode, means for applying an individual reference voltage to each of said control diodes to maintain said control diodes in a conductive state, and means for applying a control voltage of progressively increasing amplitude to said quenching and control diodes to progressively drive individual diodes to nonconduction.

6. A frequency selecting circuit which is selectively responsive to voltages which are higher than a predetermined amplitude comprising an oscillator, a plurality of crystals connected to the input of said oscillator in a manner adapted to provide oscillations at the individual frequencies of said crystals, a diode shunting each of said crystals, a voltage divider connected to a source of direct current for applying individual reference voltages to said diodes in a manner adapted to maintain said diodes in a conductive state, a source of direct current control voltage, and a common control line connected between said source of control voltage and said diodes to apply from a common source of voltage of varying amplitude to overcome the applied reference voltages and selectively drive predetermined diodes to nonconduction in response to a predetermination amplitude of said control voltage.

7. An oscillator frequency selecting circuit which is responsive to voltages which are higher than a predetermined amplitude comprising an oscillator, a plurality of crystals connected to the input of said oscillator in a manner adapted to provide oscillations at the individual frequencies of said crystals, a control diode shunting each of said crystals, a plurality of frequency quenching diodes, each of said control diodes alternately connected in series with a frequency quenching diode which is adapted to block oscillation of the associated crystal at a higher voltage than the voltage applied to the corresponding control diode, a voltage divider including a plurality of resistance elements connected in series for applying individual reference voltages to said control diodes, and a common control line for applying control voltages of progressively increasing amplitude to said control diodes to overcome the applied reference voltages and to drive predetermined diodes to nonconduction.

8. An oscillator frequency selecting matrix which is responsive to voltages which are higher than a predetermined amplitude comprising an oscillator, a plurality of crystals connected to the input of said oscillator in a manner adapted to provide oscillations at the individual frequencies of said crystals, a control diode shunting each of said crystals, a plurality of frequency quenching diodes, each of said control diodes alternately connected in series with a frequency quenching diode which is adapted to block oscillation of the associated crystal at a higher voltage than the voltage applied to the corresponding control diode, a voltage divider circuit for applying individual reference voltages to each of said control diodes, said circuit comprising a plurality of resistors connected in series, the junction point of each of said resistors connected to alternate junction points of said frequency quenching diodes and said control diodes, and a common control line connected to the remaining junction points of said frequency quenching diodes and said control diodes for applying control voltages of progressively increasing amplitude to said control diodes to overcome the applied reference voltages to drive predetermined diodes to nonconduction.

9. An oscillator frequency selecting circuit which is responsive to voltages which are higher than a predetermined amplitude comprising an oscillator, a plurality of crystals connected to the input of said oscillator in a manner adapted to provide oscillations at the individual frequencies of said crystals, a plurality of frequency quenching diodes, a control diode shunting each of said crystals, each of said control diodes alternately connected in series with a frequency quenching diode which is adapted to block oscillation of the associated crystal at a higher voltage than the voltage applied to the corresponding control diode, a voltage divider including a plurality of resistance elements connected in series for applying individual reference voltages to said control diodes, a common control line for applying control voltages of progressively increasing amplitude to said control diodes to overcome the applied reference voltages and to drive predetermined diodes to nonconduction, and a decoupling network connected between said common control line and the junction of each control diode and its associated crystal for preventing interaction between said crystals.

References Cited in the file of this patent

UNITED STATES PATENTS

| | | |
|---|---|---|
| 2,553,366 | Fry | May 15, 1951 |
| 2,616,960 | Dell | Nov. 4, 1952 |
| 2,735,940 | Norby | Feb. 21, 1956 |